(12) United States Patent
Wild

(10) Patent No.: US 11,910,539 B2
(45) Date of Patent: Feb. 20, 2024

(54) MECHATRONIC CURTAIN FOR A PROCESS CHAMBER FOR CARRYING OUT THERMAL PROCESSES IN THE MANUFACTURE OF ELECTRONIC ASSEMBLIES

(71) Applicant: Rehm Thermal Systems GmbH, Blaubeuren-Seissen (DE)

(72) Inventor: Paul Wild, Blaubeuren-Seissen (DE)

(73) Assignee: REHM THERMAL SYSTEMS GMBH, Blaubeuren-Seissen (DE)

( * ) Notice: Subject to any disclaimer, the term of this patent is extended or adjusted under 35 U.S.C. 154(b) by 888 days.

(21) Appl. No.: 16/930,552

(22) Filed: Jul. 16, 2020

(65) Prior Publication Data

US 2021/0037659 A1 Feb. 4, 2021

(30) Foreign Application Priority Data

Jul. 29, 2019 (DE) .......................... 102019211212.9

(51) Int. Cl.
*H05K 3/34* (2006.01)
*G01B 11/24* (2006.01)
*G01B 17/06* (2006.01)

(52) U.S. Cl.
CPC .............. *H05K 3/34* (2013.01); *G01B 11/24* (2013.01); *G01B 17/06* (2013.01); *H05K 2203/081* (2013.01)

(58) Field of Classification Search
CPC .... H05K 3/34; H05K 2203/081; G01B 11/24; G01B 17/06
USPC ......................................................... 34/202
See application file for complete search history.

(56) References Cited

U.S. PATENT DOCUMENTS

| | | | |
|---|---|---|---|
| 5,031,818 A | | 7/1991 | Gieskes ........................... 228/42 |
| 5,746,008 A | * | 5/1998 | Yamashita ........ H01L 21/67772 34/217 |
| 67,964,483 | | 9/2004 | Weber et al. .................. 228/219 |
| 9,513,053 B2 | * | 12/2016 | Zielinski ................... F26B 5/04 |
| 10,876,792 B2 | * | 12/2020 | Zielinski ................. F26B 9/106 |

(Continued)

FOREIGN PATENT DOCUMENTS

| | | |
|---|---|---|
| DE | 8520254 U1 | 10/1985 |
| DE | 4019962 | 1/1991 |

(Continued)

OTHER PUBLICATIONS

German Office Action or Search Report dated Jul. 1, 2020 in corresponding German application 10 2019 211 212.9, 4 pages.

(Continued)

*Primary Examiner* — Stephen M Gravini
(74) *Attorney, Agent, or Firm* — Fattibene and Fattibene, LLC; Paul A. Fattibene

(57) ABSTRACT

A process chamber for carrying out thermal processes in the manufacture of an electronic assembly with at least one opening for moving in and/or removing the electronic assembly; a supply of a protective gas; a controllable protection device arranged at the opening to reduce escape of the protective gas from the process chamber; and a control that can control the protection device such that, when the electronic assembly passes through the opening, an opening cross section of the opening is provided, which corresponds to the cross section of the electronic assembly.

15 Claims, 3 Drawing Sheets

(56) References Cited

U.S. PATENT DOCUMENTS

| | | |
|---|---|---|
| 10,914,521 B2 * | 2/2021 | Bernard .............. G01M 3/3281 |
| 11,486,641 B2 * | 11/2022 | Gümbel .................. F25B 21/02 |
| 11,504,786 B2 * | 11/2022 | Rehm .................... B23K 1/008 |
| 11,624,691 B2 * | 4/2023 | Campbell ................. F26B 3/04 |
| | | 34/427 |
| 2021/0037659 A1 * | 2/2021 | Wild ..................... F27D 1/1858 |

FOREIGN PATENT DOCUMENTS

| | | | | |
|---|---|---|---|---|
| DE | 19749184 | | 5/1999 | |
| DE | 19912718 | | 2/2000 | |
| DE | 19953654 | | 5/2001 | |
| DE | 102017126978 A1 * | 5/2019 | ............. F25B 21/02 |
| WO | WO 2007/088695 | | 8/2007 | |
| WO | WO-2019096638 A1 * | 5/2019 | ............. F25B 21/02 |

OTHER PUBLICATIONS

European Office Action or Search Report dated Dec. 17, 2020 in corresponding European application 20188295.8, 7 pages.

* cited by examiner

MECHATRONIC CURTAIN FOR A PROCESS CHAMBER FOR CARRYING OUT THERMAL PROCESSES IN THE MANUFACTURE OF ELECTRONIC ASSEMBLIES

FIELD OF THE INVENTION

The present invention relates to devices for carrying out thermal processes in the manufacture of electronic assemblies. In particular, the present invention relates to a process chamber using a protective gas.

BACKGROUND OF THE INVENTION

In the manufacture of electronic assemblies various thermal processes such as soldering, drying and functional testing take place at high and low temperatures. To avoid oxidation or icing during the thermal process the process chamber is flooded continuously or intermittently with protective gas, an inert gas such as nitrogen.

In typical facilities for the manufacture of electronic assemblies, the assemblies are automatically conveyed from one process station to the next. For example, a printed circuit board is coated with a solder mask and dried in a process station after its manufacture. The printed circuit board is then coated with solder paste in another process station and equipped with components in a subsequent process station. The assembled printed circuit board is then transferred to the reflow soldering process station and then to a station where the electronic assembly is coated with a protective lacquer. Subsequently, functional tests can be carried out, for example at low and high temperatures. The individual stations are not hermetically sealed areas in which a protective gas atmosphere is permanently maintained. That is, the process stations are open so as to not obstruct the work flow. It also means that the protective gas atmosphere volatilizes and the concentration of the protective gas atmosphere at the process site can only be maintained if protective gas is constantly supplied.

In the case of facilities based on the intermittent and, in particular, the continuous flow principle, the workpieces must be brought into the process chamber and removed therefrom. For this purpose, the process chamber must have appropriate openings at and in the chamber. Through these openings the inert gas flows out and thus is lost. To avoid this the cross section of these openings is reduced by appropriate devices such as curtains, bellows, sliding flaps, etc., to reduce the size of the opening.

For example, slat curtains with a plurality of slats are used that hang down and rise from the bottom to the top, made of a fabric laminated with conductive synthetic material that is temperature stable up to 160° C., for example. The slats are so rigid that the slats, which hang down from the bottom to the top, do not collapse. The slats in the inlet of the process chamber are configured to reduce the opening cross section of a process chamber to the largest cross-sectional area of the assemblies to be fed. In the outlet of the process chamber the upper and lower slats lie on top of each other, i.e. they overlap. However, the slats are flexible enough so that they bend to the side when an assembly is fed through the opening.

A disadvantage of this method in the inlet and outlet is that they only reduce the cross section at a certain distance from the passing workpieces, which still allows a relatively large amount of protective gas to escape. If the distance is selected too large too much protective gas escapes. If the distance is selected too small components on the assembly can be displaced, and in addition, too much abrasion and wear and thus contamination occurs when the components touch or bend the slats.

A compromise is therefore sought between loss of protective gas, protection of the assemblies against displacement of components and wear. The "safety distance" between the surface of the assembly and the slats leaves a net opening area through which protective gas can escape, which corresponds to the difference between the opening area reduced by the slats and the assembly cross-sectional area. If no assembly passes the opening, the opening area through which protective gas can escape corresponds to the net opening area which is larger than the difference in area. That is, during the thermal process, when no assembly passes the opening, more protective gas escapes.

It is therefore an object of the present invention to provide a device for a process chamber which reduces the cross section of the opening flexibly and efficiently so that less protective gas can escape.

SUMMARY OF THE INVENTION

The present object is achieved by a process chamber according to an embodiment of the invention. The process chamber is configured to carry out thermal processes in the manufacture of an electronic assembly, the process chamber comprising: at least one opening for moving in and/or removing the electronic assembly and means for supplying a protective gas. The process chamber is characterized by a controllable protection means arranged at the opening to reduce escape of protective gas from the process chamber; and by a control means that can control the protection means such that, as the electronic assembly passes the opening, an opening cross section of the opening is provided which corresponds to the cross section of the electronic assembly.

The opening of the process chamber is controlled by the controllable protection means such that the opening is individually adapted to the assembly topography so that the area through which protective gas can escape is minimized. According to the state of the art slat curtains are used to reduce the opening cross section. However, the slat curtains cannot be controlled. Although the flexible slats allow variability of the assembly cross section, they are not able to minimize the opening cross section individually depending on the assembly.

According to an embodiment of the present invention, the protection means consists of a plurality of individually controllable segments. Since the assembly topography can be formed very differently, the protection means must be able to adapt to relatively small topography details. This is solved by a plurality of individually controllable segments.

In order to be able to adapt to assemblies equipped on both sides in a better way when controlling the opening, the plurality of individually controllable segments can be arranged in the opening such that the individually controllable segments are arranged above and below the electronic assembly when the electronic assembly passes through the opening.

In an embodiment, the control means is configured such that the control means controls the individually controllable segments such that for each segment a defined distance between the electronic assembly and the segment is maintained while the electronic assembly passes the opening. That is, when the assembly runs through the opening, the distance between the surface of the assembly and each individual segment is permanently readjusted so that the difference between the controlled opening cross section and the assembly cross section at the current passage position through the opening remains almost constantly small. Even if a very high component is followed by a very low component on an assembly, the difference area through which protective gas can escape remains constantly small.

In yet another embodiment, the process chamber also comprises a measuring means that detects the topography of the electronic assembly. The measuring means advantageously is arranged at a location in the process chamber where the topography of the electronic assembly can be detected before it passes the opening. The control means advantageously is configured such that topography data from the measuring means can be used for individual control of the segments in order to maintain the defined distances between the individual segments and the surface of the electronic assembly.

According to embodiments of the present invention, the electronic assembly consists of a plurality of electronic components mounted on an upper and/or lower surface of a printed circuit board.

In specific embodiments the measuring means uses 2D and/or 3D imaging measurement methods and/or optical measurement methods and/or mechanical measurement methods and/or acoustic measurement methods to detect the topography of the electronic assembly. To determine location-dependent height information of the electronic assembly one or a plurality of cameras can be used to create a three-dimensional model of the assembly. Alternatively, or to support the evaluation of the camera images, the height information can also be obtained interferometrically with a laser or an array of lasers. Alternatively and in support of the methods mentioned above, mechanical tactile methods or acoustic methods such as generating and evaluating a sound field can also be used to obtain height information. Alternatively and in support of the aforementioned methods, the 2/3D data of the assembly geometry can be adopted from the previous processes, such as assembly design and/or equipping process.

In a specific embodiment the process chamber also comprises a plurality of actuating means corresponding to the plurality of individually controllable segments, by which the individually controllable segments can be moved in a vertical direction. Thus, the distances between the individually controllable segments and the surface of the electronic assembly can be adjusted. The actuating means can include an electric or pneumatic drive means.

In specific embodiments the individually controllable segments are made of stainless steel. Stainless steel is an inert, robust material with a low tendency to corrosion, so that segments formed in this way require little maintenance and do not affect the processes. Furthermore, stainless steel is conductive and is therefore able to dissipate static electricity which can have a negative effect on electronic assemblies. Since stainless steel further is very dimensionally stable, individually controllable segments of stainless steel allow precise positioning relative to the surface of the electronic assembly and relative to each other.

Alternatively, the individually controllable segments can be made of a conductive synthetic material that is stable up to 240° C., such as PEEK, if attention must be paid to the cost of the device.

BRIEF DESCRIPTION OF THE FIGURES

The present invention is now described by way of the following Figures, in which.

DETAILED DESCRIPTION OF THE INVENTION

The present invention refers to a process chamber for carrying out thermal processes in the manufacture of electronic assemblies. In the manufacture of electronic assemblies, the individual process steps such as coating, assembling, soldering, painting, testing, etc. are not hermetically separated from each other. The electronic assemblies are conveyed between the individual processing steps on a conveying means between the process stations/process chambers. The process chambers have openings to bring the electronic modules in and out of the chamber. The manufacturing process therefore takes place in an open environment which facilitates the work flow. However, the thermal processes take place in a protective gas atmosphere to avoid oxidation. For this purpose by locally supplying protective gas a local protective gas atmosphere is created. Due to the open character of the process sequences this is a dynamic equilibrium for the protective gas concentration at the processing site, in which enough protective gas is constantly added locally to compensate for the outflow through openings. The smaller the openings the less protective gas has to be added to maintain a certain concentration at the processing site. The present invention was made in order to maintain the open character of the process sequences and to keep the necessary openings as small as possible. This reduces the consumption of protective gas. Furthermore, a more stable process environment is created and the process results are more reproducible.

In order to reduce the opening cross section around the workpiece depending on the assembly and thus reduce the loss of the inert protective gas, the opening cross section is actively adapted to the topography of a workpiece. For this purpose, the topography of the workpiece can first be determined using 2D and/or 3D imaging, optical, mechanical and/or acoustic measuring methods. Alternatively and in support of the previously mentioned methods, the 2/3D data of the assembly geometry can be taken from previous processes such as assembly development and/or equipping process. On the basis of this measurement data a device composed of pneumatically, electrically or mechanically controlled individual elements can map the topography of the workpiece in the running direction as a negative form such that the workpieces can pass the opening at the smallest possible distance.

Figure 1:
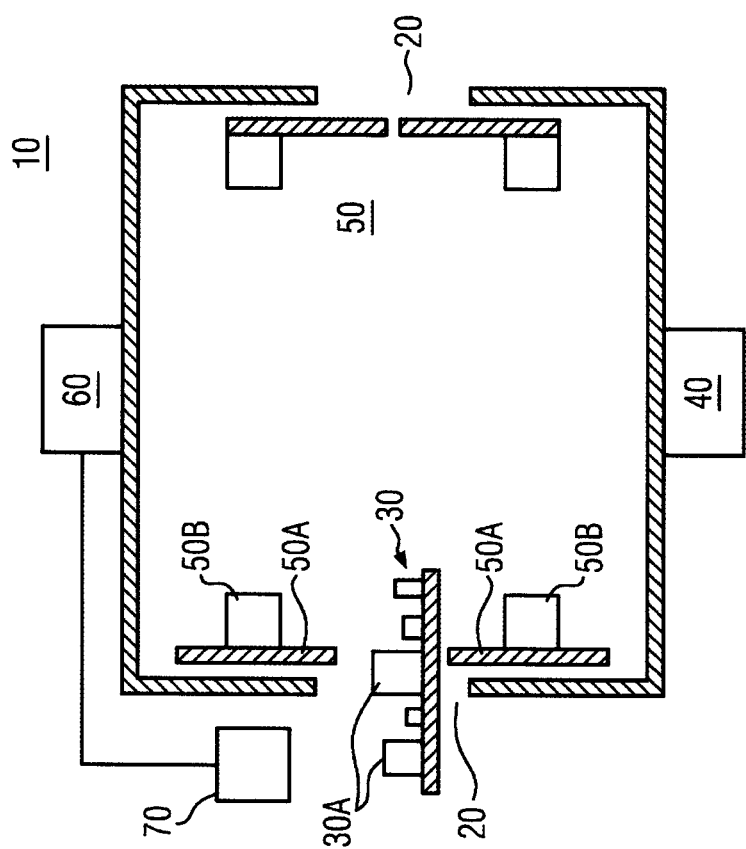
FIG. 1 shows a cross-sectional view of a process chamber according to the present invention.

FIG. 1 schematically shows a cross-sectional view of a process chamber according to the present invention. In the cross section of FIG. 1 reference numeral 10 indicates a process chamber, reference numeral 20 an opening, reference numeral 30 an electronic assembly, reference numeral 30A components of the assembly, reference numeral 40 a means for supplying a protective gas, reference numeral 50 a controllable protection means, reference numeral 50A an individually controllable segment, reference numeral 50B an actuating means, reference numeral 60 a control means and reference numeral 70 indicates a measuring means. FIG. 1 shows the process chamber 10 with two openings 20, which are provided for the insertion or removal of the electronic assembly 30.

In the arrangement shown in FIG. 1 an assembly 30 is fed into the process chamber 10. The illustration in FIG. 1 shows a condition at moment $t_1$ when the assembly 30 passes the opening 20 of the inlet. At this moment $t_1$ the control means 60 has already caused the actuating means 50B of the protection means 50 to retract the segments 50A of the protection means 50 to such an extent that the electronic assembly 30 fits through the opening, taking into account the height of the component 30A currently situated at the location of the protection means. A safety distance is maintained between the individually controllable segment 50A and the surface of the component 30A.

In the arrangement shown in FIG. 1 at moment $t_1$ no electronic assembly passes the opening at the outlet of process chamber 10. Accordingly, the individually controllable segments 50 A are positioned such that they almost close the process chamber 10 or leave an opening free that corresponds to a safety distance of the individually controllable segments 50A to each other or to adjacent structures.

At a later moment $t_2$ (not shown) at which a subsequent component 30A is situated located at the location of the protection means 50, the control means 60 causes the actuating means 50B of the protection means 50 to adapt the position of the segments 50A of the protection means 50 to the height of the subsequent component 30A.

The height information of the components 30A can be determined, for example, with a measuring means 70 at a previous moment $t_0$ (not shown) before the electronic assembly 30 passes the opening 20. For example, a 3D model of the electronic assembly 30 can be created using imaging techniques, such as a camera, from which the height information of the electronic assembly 30A can be read. Together with position and speed data of the electronic assembly 30 relative to process chamber 10 the control means 60 can calculate at what time a specific component with a specific height at the location of the protection means 60 passes the opening 20. Accordingly, the control means 60 can control the actuating means 50B to position the individually controllable segments 50A according to the height of the component 30A.

Alternatively or in combination, the height information of the 30A components can be determined with a mechanical probe and/or interferometric sensors directly at the inlet of the opening 20.

Preferably, the individually controllable segments 50A are made of stainless steel. This results in durable, dimensionally stable and conductive segments. Corrosion and abrasion are low, so that less maintenance is required. Furthermore, the conductivity ensures the dissipation of static electricity which is generated, for example, during conveyance on the electronic assembly. A better dissipation of static electricity can be achieved, for example, by soft conductive brushes at the end of the individually controllable segments, which can dissipate static charges. Since the segments made of stainless steel are dimensionally stable and can be manufactured with high precision, safety distances to components or other parts of the process chamber can be minimized, thus minimizing the net opening through which protective gas can escape. Net opening means a net opening area through which protective gas can escape. The net opening area is the difference between the opening area reduced by the individually controllable segments and the assembly cross-sectional area. The net opening area results from the safety distances between the individually controllable segments and the electronic assembly.

If lower demands are made on precision and minimization of consumables and maintenance, a conductive temperature-stable synthetic material can also be used as the material for the individually controllable segments, thus reducing the manufacturing costs for the process chamber.

Electrical, electromechanical, or pneumatic driving means are preferably used as actuating means. For example, a stepper motor with defined step size, a pneumatic piston with position detection, an electric motor with position detection of the individually controllable segments, etc. could be used.

The control means 60 can communicate wirelessly or connected by wire with the measuring means 70 and the actuating means 50B.

Figure 2:
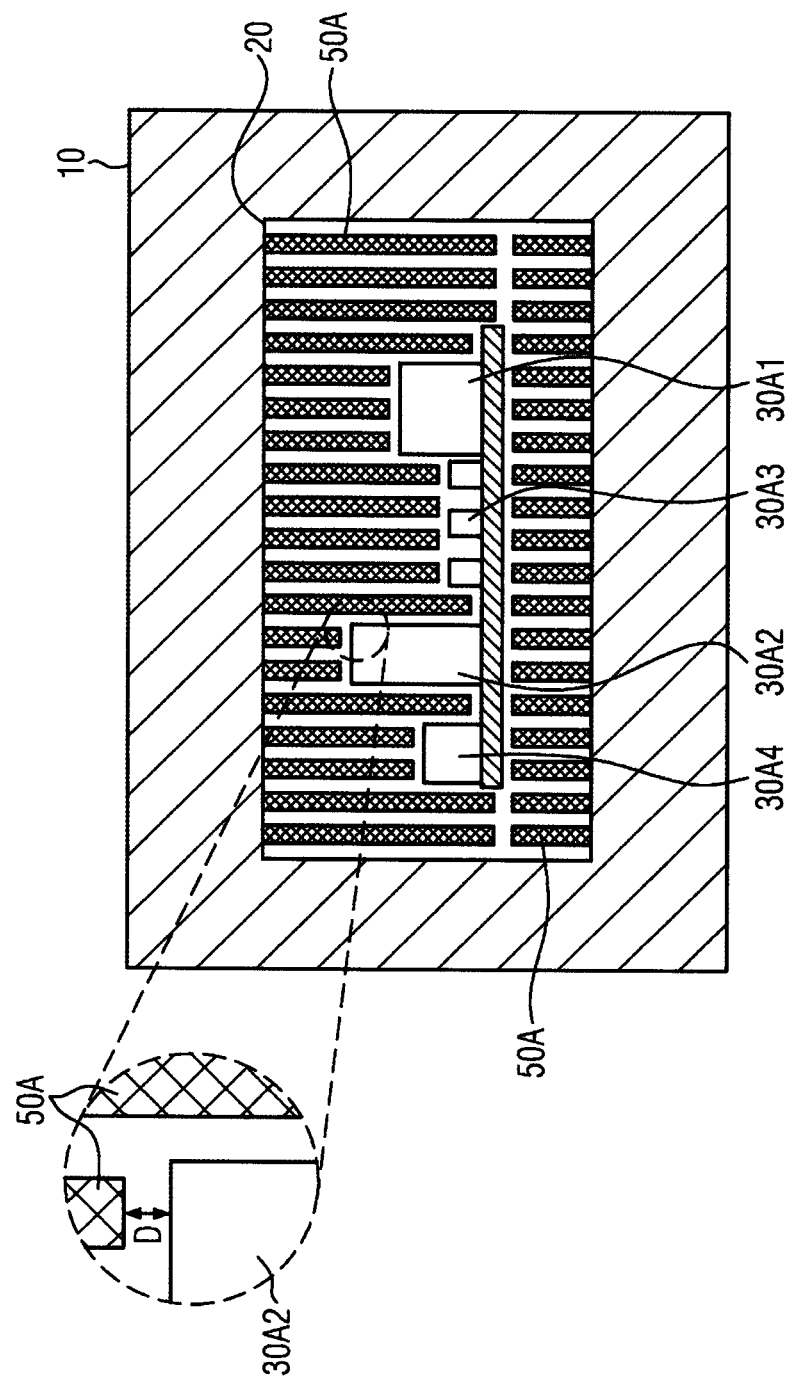
FIG. 2 shows a front view at an opening of the process chamber according to the present invention, and FIG. 3 schematically shows a comparison between the state of the art and the present invention which shows the mode of action of a curtain.

FIG. 2 shows a schematic front view at the opening 20 of the process chamber 10 according to the present invention at the previously described moment $t_1$.

The individually controllable segments 50A reduce the area of the opening 20. The electronic assembly provided with components 30A1, 30A2, 30A3 and 30A4 of different heights on one side passes the opening 20. At this moment the height profile has already been determined and the corresponding individually controllable segments have been positioned so that they follow the contour of the cross section of the electronic assembly at this point. In the enlarged detail the safety distance D between the component 30A2 and the individually controllable segment 50A can be seen. To improve clarity the safety distances are not shown to scale but exaggerated.

Figure 3:
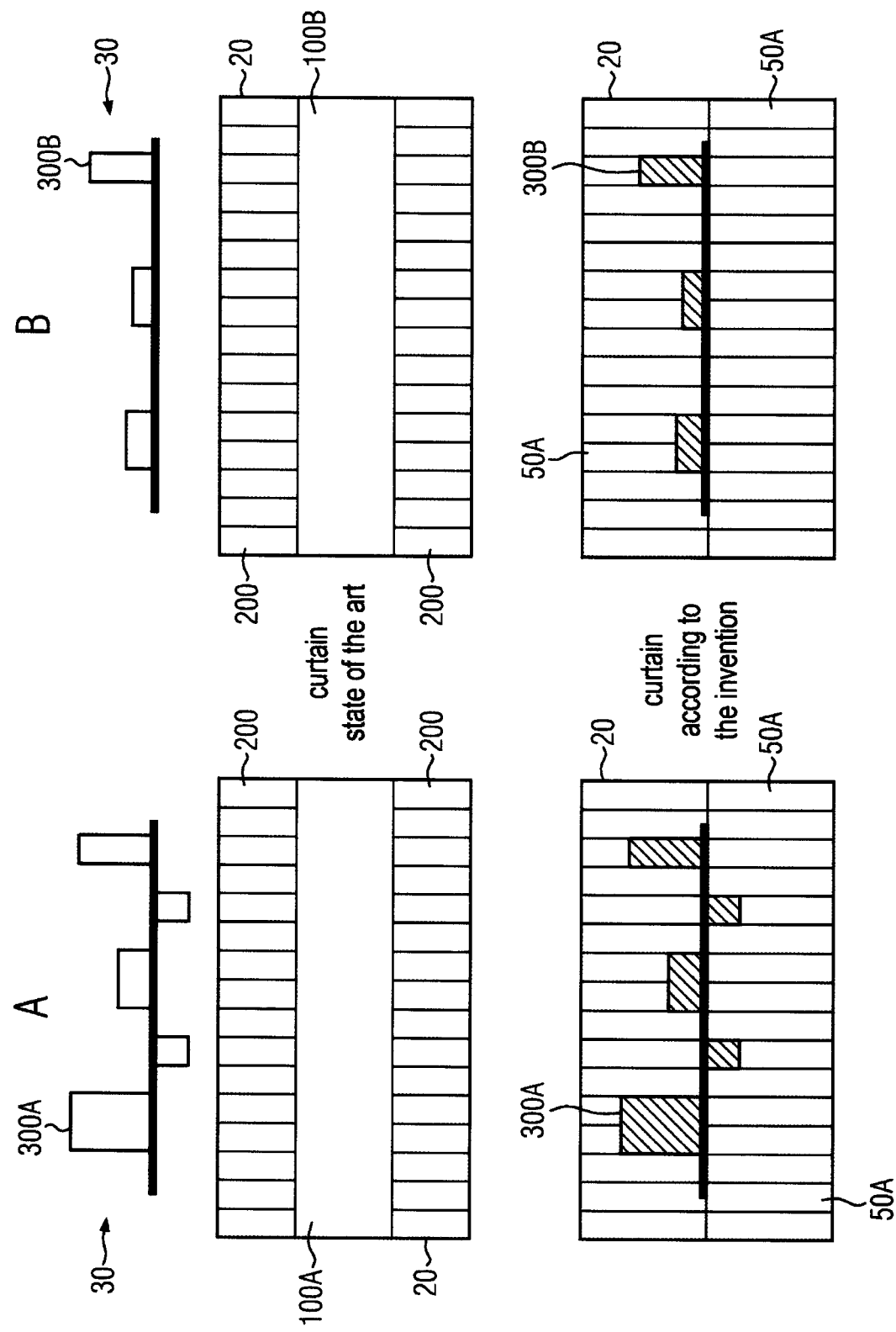

FIG. 3 schematically shows a comparison of the mode of action of a protection means for reducing the escape of protective gas from a process chamber between the state of the art and the present invention. In the state of the art such protection means are often referred to as "curtains" and are often realized as "slat curtains". In the present invention, the protection means is referred to as a mechatronic curtain, since the position of the individual slat can be individually adjusted by means of a control via corresponding drives.

FIG. 3 further shows a comparison of the curtain control between two different electronic modules. Assembly A is equipped on both sides and has an outline/contour 300A. Assembly B is equipped with lower electronic components on only one side. Assembly B has an outline 300B. The curtain according to the state of the art comprises a plurality of slats 200, which reduce the opening area of the opening 20. If the assembly A passes the opening 20 according to the state of the art the net opening area is 100A, through which protective gas can escape. The net opening area 100A is the difference between the opening area reduced by the curtain and the area of the contour 300A of the assembly A. Accordingly, a net opening area of 100B is obtained when the assembly B passes the opening 20. Since the assembly B is only equipped on one side and has smaller components, the area of contour 300B is smaller than the area of contour 300A. The net opening area 100B is larger than the net opening area 100A, so more protective gas escapes when assembly B passes the opening. If no assembly passes the opening the net opening area is larger than the net opening areas 100A and 100B because the position of the curtain slats 200 of the state of the art are not changed.

In contrast, the slats of the curtain according to the invention are individually controllable segments 50A which adapt to the contour 300A/300B of the respective assembly A/B. The net opening area of a curtain/protection means 50 according to the invention is almost the same for both assemblies and is determined by the safety distance D of the segments 50A to the electronic assembly 30. This means that a net opening area through which protective gas can escape can be minimized independently of the assembly.

What is claimed is:

1. A process chamber for carrying out thermal processes in a manufacture of an electronic assembly comprising:
    at least one opening for introducing and/or removing the electronic assembly;
    means for supplying a protective gas;
    controllable protection means arranged at the opening to reduce escape of protective gas from the process chamber; and
    control means that can control the protection means such that, when the electronic assembly passes the opening, an opening cross section of the opening is provided, which corresponds to a cross section of the electronic assembly,
    wherein the opening of the process chamber is controlled by the controllable protection means such that the opening is individually adapted to an assembly topography of the electronic assembly so that the area through which protective gas can escape is minimized.

2. The process chamber according to claim 1, wherein: the protection means comprises a plurality of individually controllable segments.

3. The process chamber according to claim 2, wherein: the plurality of individually controllable segments are arranged in the opening such that they are arranged above and/or below the electronic assembly when the electronic assembly passes through the opening.

4. The process chamber according to claim 2, wherein: the control means is configured such that the control means controls the individually controllable segments such that for each segment a defined distance between the electronic assembly and the segment is maintained while the electronic assembly passes the opening.

5. The process chamber according to claim 1, further comprising:
    measuring means for detecting the assembly topography of the electronic assembly.

6. The process chamber according to claim 5, wherein: the control means is configured to use topography data of the measuring means for individual control of the segments in order to maintain the defined distances between the individual segments and a surface of the electronic assembly.

7. The process chamber according to claim 1, wherein: the electronic assembly consists of a plurality of electronic components mounted on a top and/or bottom surface of a printed circuit board.

8. The process chamber according to claim 5, wherein: the measuring means uses imaging 2D and/or 3D measuring methods and/or optical measuring methods and/or mechanical measuring methods and/or acoustic measuring methods for detecting the assembly topography of the electronic assembly.

9. The process chamber according to claim 5, wherein: the measuring means is configured to adopt existing 2D and/or 3D data of the electronic assembly.

10. The process chamber according to claim 2, further comprising:
    a plurality of actuating means corresponding to the plurality of individually controllable segments by which the individually controllable segments can be moved in a vertical direction.

11. The process chamber according to claim 10, wherein: the actuating means comprises an electric or pneumatic drive means.

12. The process chamber according to claim 2, wherein: the individually controllable segments are made of stainless steel.

13. The process chamber according to claim 2, wherein: the individually controllable segments are made of a conductive synthetic material stable up to 280° C.

14. An electronic assembly process chamber for the manufacture of an electronic assembly comprising:
    a process chamber having an opening configured to receive an electronic assembly;
    a plurality of individually controllable segments placed adjacent the opening of said process chamber along a length dimension of the opening, each of said plurality of individually controllable segments having a dimension configured to partially travers the opening of said process chamber;
    a detector, said detector positioned to detect a topography of an electronic assembly;
    an actuator coupled to each of said plurality of individually controllable segments, said actuator configured to individually control movement of each of said plurality of individually controllable segments whereby each of said plurality of individually controllable segments selectively partially traverses the opening; and
    a controller coupled to said detector and said actuator, said controller configured to receive data representative of the topography of the electronic assembly from said detector and configured to control movement of each of said plurality of individually controllable segments to selectively partially travers the opening and to come to within a selected distance of the electronic assembly based on the data representative of the topography of the electronic assembly,
    whereby the opening is reduced based on the topography of the electronic assembly reducing escape of a protective gas within said process chamber.

15. A process chamber for carrying out thermal processes in a manufacture of an electronic assembly having components with different dimensions forming an assembly topography comprising:
    an opening, said opening having an area permitting the electronic assembly to pass through said opening;
    a protective gas supply coupled to the process chamber;
    controllable segments arranged along a dimension of said opening, said controllable segments having a distal end configured to independently move into the opening a predetermined distance wherein each of said controllable segments extend along a portion of the dimension; and
    a controller coupled to said controllable segments, wherein said controller controls the predetermined distance each of said controllable segments move into the opening along the dimension of said opening to maintain a defined distance between the components forming the assembly topography and the distal end of said controllable segments,
    whereby the area of said opening is reduced based on the assembly topography of the electronic assembly reducing escape of a protective gas within said process chamber.

* * * * *